United States Patent
Sato et al.

[11] Patent Number: 5,811,948
[45] Date of Patent: Sep. 22, 1998

[54] CONTROL APPARATUS FOR ELECTRIC MOTOR

[75] Inventors: Taketoshi Sato, Kariya; Masao Yamada, Nukata-gun; Shigeru Takeuchi, Gamagoori, all of Japan

[73] Assignee: Nippondenso Co., Ltd., Kariya, Japan

[21] Appl. No.: 691,610

[22] Filed: Aug. 2, 1996

[30] Foreign Application Priority Data

Aug. 2, 1995 [JP] Japan .................................. 7-197629

[51] Int. Cl.⁶ .............................. G05B 11/28; G05F 1/40
[52] U.S. Cl. ...................... 318/434; 318/599; 318/138; 323/271; 323/265; 388/804; 363/41
[58] Field of Search ..................... 318/434, 629, 318/631, 138, 599, 254; 361/91, 56, 86, 101, 11, 31, 33; 322/28, 25, 22; 388/804, 811, 819; 323/271, 288, 782, 265, 268; 363/41, 98

[56] References Cited

U.S. PATENT DOCUMENTS

| | | | |
|---|---|---|---|
| 4,258,309 | 3/1981 | Oshaka et al. ........................... | 323/287 |
| 4,673,851 | 6/1987 | Disser ..................................... | 388/831 |
| 4,691,149 | 9/1987 | Baumgartner et al. . | |
| 4,914,540 | 4/1990 | Tabata et al. ............................. | 361/91 |
| 5,410,229 | 4/1995 | Sebastian et al. ....................... | 318/434 |
| 5,448,154 | 9/1995 | Kanke et al. .............................. | 322/22 |

FOREIGN PATENT DOCUMENTS

| | | |
|---|---|---|
| 60-046784 | 3/1985 | Japan . |
| 61-035182 | 2/1986 | Japan . |
| 64-054798 | 4/1989 | Japan . |

*Primary Examiner*—John W. Cabeca
*Attorney, Agent, or Firm*—Cushman Darby & Cushman IP Group of Pillsbury Madison & Sutro LLP

[57] ABSTRACT

An electric motor has first and second power feed terminals. A power feed line connects a dc power supply and the electric motor. A switching element provided in the power feed line includes a MOS-FET having a gate subjected to a pulse width modulation signal with a controllable duty cycle. The switching element changes between its on state and its off state in response to the pulse width modulation signal. The first power feed terminal of the electric motor is connected to the switching element. A flywheel diode connected in parallel with the electric motor operates to absorb a voltage which appears across the electric motor and returning a current when the switching element changes to its off state. A capacitor connected between the gate of the switching element and the second power feed terminal of the electric motor operates to suppress radio-frequency noise occurring upon every change of the switching element between its on state and its off state.

11 Claims, 6 Drawing Sheets

CONTROL APPARATUS FOR ELECTRIC MOTOR

BACKGROUND OF THE INVENTION

1. Field of the Invention

This invention generally relates to a control apparatus for an electric motor which includes a switching device connected to the electric motor. This invention particularly relates to a control apparatus of the type in which a switching device periodically activates and deactivates an electric motor to control the rotational speed or another parameter thereof in response to a pulse width modulation (PWM) signal.

2. Description of the Prior Art

In some automotive vehicles, a fuel pump is driven by an electric motor powered by a vehicle battery. A known control apparatus for an electric motor includes a switching device connected between a vehicle battery and an electric motor. The switching device periodically activates and deactivates the electric motor to control the rotational speed or another parameter thereof in response to a pulse width modulation (PWM) signal.

In such a known control apparatus, noise tends to be caused by switching operation of a switching device. The noise interferes with operation of another electronic apparatus such as a radio receiver provided in an automotive vehicle.

SUMMARY OF THE INVENTION

It is an object of this invention to provide an improved control apparatus for an electric motor.

A first aspect of this invention provides a control apparatus for an electric motor having first and second power feed terminals. The apparatus includes a dc power supply, a power feed line connecting the dc power supply and the electric motor, and, a switching element provided in the power feed line. The switching element includes a MOSFET having a gate subjected to a pulse width modulation signal with a controllable duty cycle. The switching element changes between its on state and its off state in response to the pulse width modulation signal. The first power feed terminal of the electric motor is connected to the switching element. The apparatus further includes a flywheel diode connected in parallel with the electric motor for absorbing a voltage which appears across the electric motor and returning a current when the switching element changes to its off state, and a capacitor connected between the gate of the switching element and the second power feed terminal of the electric motor for suppressing radio-frequency noise occurring upon every change of the switching element between its on state and its off state.

A second aspect of this invention is based on the first aspect thereof, and provides a control apparatus further comprising a resistor connected between the gate of the switching element and one out of positive and negative terminals of the dc power supply for suitably setting a switching speed related to the switching element.

A third aspect of this invention is based on the first aspect thereof, and provides a control apparatus further comprising a resistor connected in series with the capacitor for limiting a current flowing through the capacitor.

A fourth aspect of this invention is based on the first aspect thereof, and provides a control apparatus further comprising a second capacitor connected to the electric motor for absorbing a ripple current which flows through the electric motor due to switching operation of the switching element.

A fifth aspect of this invention is based on the first aspect thereof, and provides a control apparatus further comprising an LC filter provided in the power feed line for blocking propagation of switching noise from the switching element toward the dc power supply, the LC filter including a combination of a choke coil and a filter capacitor.

A sixth aspect of this invention provides an apparatus comprising a dc power supply, an electric motor, a switch and a capacitor having first and second ends. The dc power supply, the electric motor, and the switch are connected in a closed loop. The switch has a control terminal subjected to a pulse width modulation signal. The switch changes between its on state and its off state in response to the pulse width modulation signal. The first end of the capacitor is connected to the control terminal of the switch, and the second end of the capacitor is connected to a junction between the electric motor and the power supply.

A seventh aspect of this invention is based on the sixth aspect thereof, and provides an apparatus further comprising a resistor connected in series with the capacitor.

DESCRIPTION OF THE PREFERRED EMBODIMENTS

A prior-art apparatus will be described hereinafter for a better understanding of this invention.

Figure 1:
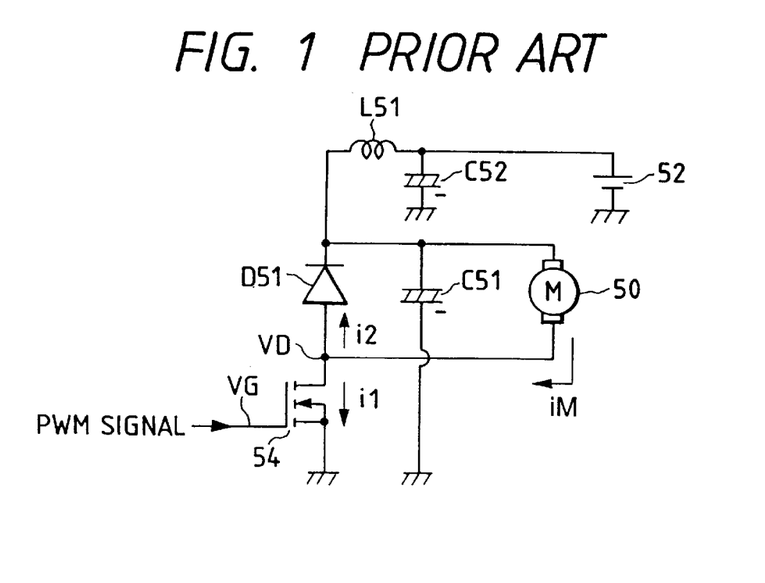
FIG. 1 is a schematic diagram of a prior-art control apparatus for an electric motor.

FIG. 1 shows a prior-art control apparatus for an electric motor 50. With reference to FIG. 1, a first terminal of the motor 50 is connected to the positive terminal of a dc power supply 52 via a choke coil L51. A second terminal of the motor 50 is connected to the negative terminal of the dc power supply 52 via a switching element 54 and a ground. Thus, the switching element 54 is connected to a negative side of the dc power supply 52 relative to the motor 50. Accordingly, the switching element 54 forms a low side switch. The switching element 54 includes an n-channel MOSFET.

In the prior-art control apparatus of FIG. 1, the cathode and the anode of a flywheel diode D51 are connected to the first and second terminals of the motor 50, respectively. The flywheel diode D51 absorbs a high voltage which occurs across the motor 50 upon every change of the switching element 54 to its off state. The flywheel diode D51 returns a current, corresponding to the high voltage, toward the motor 50.

In the prior-art control apparatus of FIG. 1, the gate of the switching element 54 is subjected to a pulse width modulation (PWM) signal having an adjustable duty cycle (an adjustable duty factor). The switching element 54 periodically changes between its on state and its off state in response to the PWM signal. When the switching element 54 is in its on state, a current (a motor current iM) caused by the dc power supply 52 is allowed to flow through the motor 50. Accordingly, in this case, the motor 50 is activated. When the switching element 54 is in its off state, the motor current iM is interrupted so that the motor 50 is deactivated. Thus, the motor 50 is periodically activated and deactivated in response to the PWM signal. In addition, the motor current iM is controlled in response to the PWM signal.

In the prior-art control apparatus of FIG. 1, one end of a capacitor C52 is connected to the junction between the choke coil L51 and the positive terminal of the dc power supply 52. The other end of the capacitor C52 is grounded. The choke coil L51 and the capacitor C52 compose an LC low pass filter which serves to absorb noise (switching noise) caused by switching operation of the switching element 54. Thus, the LC low pass filter prevents the switching noise from leaking toward a side of the dc power supply 52.

In the prior-art control apparatus of FIG. 1, one end of a capacitor C51 is connected to the junction between the cathode of the flywheel diode D51 and the first terminal of the motor 50. The other end of the capacitor C51 is grounded. The capacitor C51 absorbs ripple components of the motor current iM.

For a long life of a brush in the motor 50, it is desirable that the switching frequency related to the switching element 54 corresponds to a value greater than the time constant of the motor 50. In order to suppress the level of sound caused by magnetism in the motor 50, it is desirable to set the switching frequency higher than an audible range. In order to prevent the motor 50 from interfering with other devices and to suppress a switching loss, it is preferable to set the switching frequency to a low value. Accordingly, in the prior-art control apparatus of FIG. 1, the switching frequency related to the switching element 54 is set in the range of several kilohertz to several tens of kilohertz.

In the prior-art control apparatus of FIG. 1, radio-frequency noise tends to occur upon every change of the switching element 54 between its on state and its off state. The frequencies of components of the noise are in an MF (medium frequency) band and also a VHF (very high frequency) band. Thus, the radio-frequency noise interferes with a radio receiver.

Figure 2:
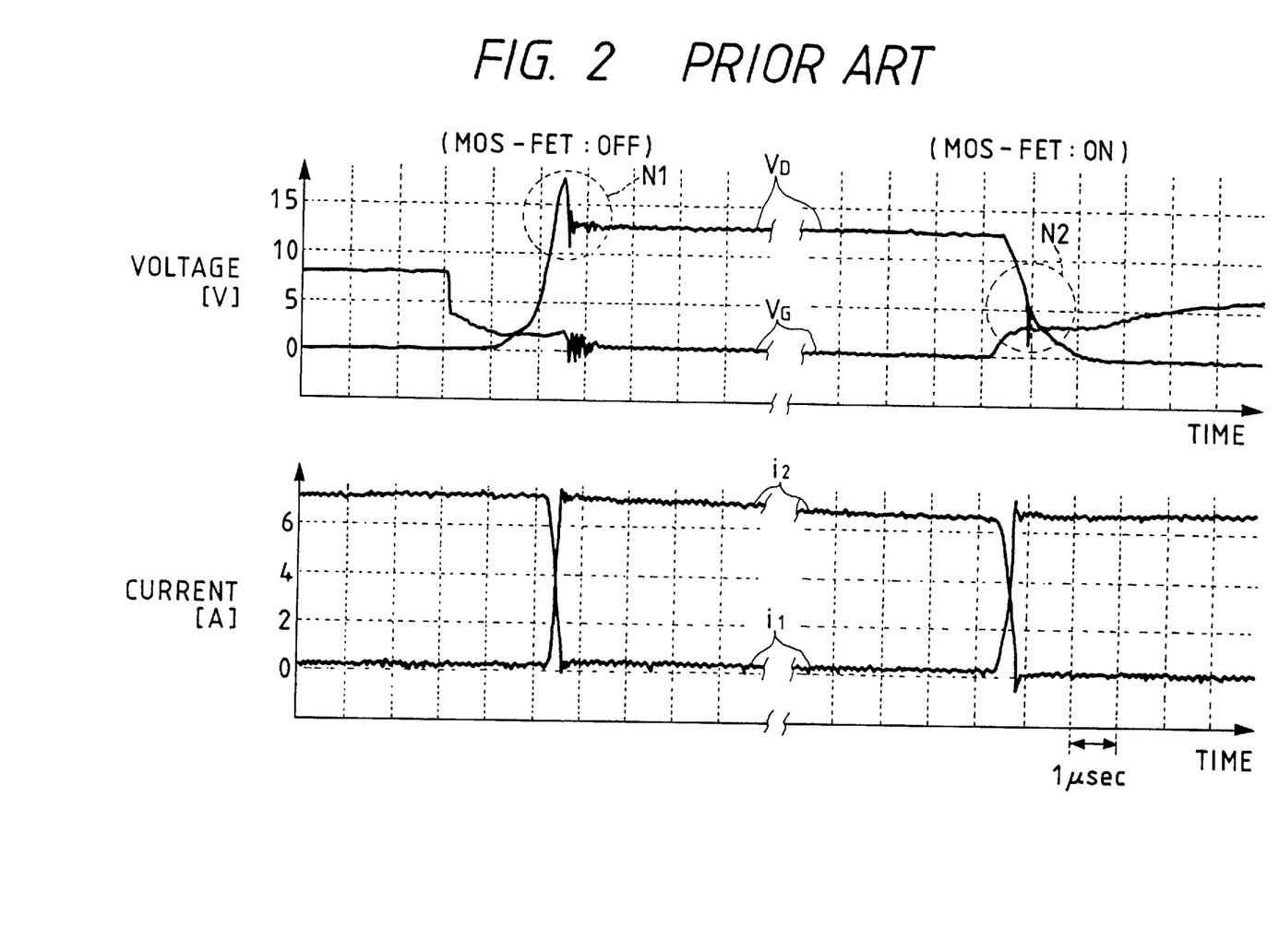
FIG. 2 is a time-domain diagram of voltages and currents in the prior-art control apparatus of FIG. 1.

Experiments were performed on the prior-art control apparatus of FIG. 1. During the experiments, the prior-art control apparatus of FIG. 1 remained operational while measurements were taken of the voltage VD at the anode of the flywheel diode D51, the gate voltage VG of the switching element 54, the motor current i1 flowing through the motor 50 and the switching element 54, and a flywheel current i2 flowing through the flywheel diode D51. FIG. 2 shows the experimentally-available time-domain variations in the voltages VD and VG and the currents i1 and i2.

With reference to FIG. 2, a current i1 flows from the dc power supply 52 to the ground line via the motor 50 and the switching element 54 as a motor current iM while the switching element 54 continues to be in its on state. When the switching element 54 changes from its on state to its off state, the current i1 is interrupted and a flywheel current i2 occurs therefor. The flywheel current i2 is directed toward the motor 50. Upon every change of the switching element 54 to its off state, the voltage VD at the anode of the flywheel diode D51 overshoots due to the impedance of a path along which the flywheel current i2 flows. The overshoot causes voltage ripples (see the region N1 in FIG. 2) in the power feed line between the dc power supply 52 and the motor 50. The frequencies of the voltage ripples are in the range of several hundreds of kilohertz to several megahertz. The voltage ripples are propagated toward the dc power supply 52 as MF-band noise.

It is conceivable to remove the voltage ripples by a LC filter. The parameters of the parts of such LC filter must be great. Thus, a control apparatus including such an LC filter tends to be large in size. To suppress the voltage ripples, it is conceivable to shorten the flywheel current path to decrease the impedance thereof. Shortening the flywheel current path is limited due to the spatial constraints upon placing the parts.

With reference to FIG. 2, the flywheel current i2 flows toward the motor 50 while the switching element 54 continues to be in its off state. When the switching element 54 changes from its off state to its on state, the flywheel current i2 is interrupted and the current i1 restarts to flow from the dc power supply 52 to the ground line via the motor 50 and the switching element 54 as a motor current iM. Upon every change of the switching element 54 to its on state, a recovery current in the flywheel diode D51 causes a ringing (see the region N2 in FIG. 2) which vibrates the anode voltage VD of the flywheel diode D51 at a frequency in the range of several megahertz to several tens of megahertz. The voltage vibrations are propagated toward the dc power supply 52 as VHF-band noise.

Figure 3:
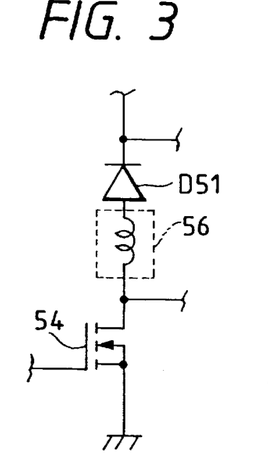
FIG. 3 is a schematic diagram of a part of a first conceivable control apparatus.

FIG. 3 shows a first conceivable control apparatus which is not prior art with respect to this invention. In the control apparatus of FIG. 3, a path along which a flywheel current flows is provided with ferrite beads 56 to suppress radio-frequency noise. Specifically, the connection between the anode of the flywheel diode D51 and the second terminal of the motor 50 has the ferrite beads 56.

In the conceivable control apparatus of FIG. 3, the ferrite beads 56 cause a great inductance of the flywheel current path which suppresses abrupt current variations and thereby suppresses VHF-band noise. On the other hand, the great inductance of the flywheel current path tends to increase an overshoot which occurs upon every change of the switching element 54 to its off state. Accordingly, in the conceivable control apparatus of FIG. 3, it tends to be difficult to suppress MF-band noise.

Figure 4:
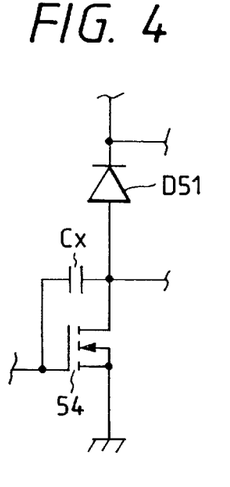
FIG. 4 is a schematic diagram of a part of a second conceivable control apparatus.

FIG. 4 shows a second conceivable control apparatus which is not prior art with respect to this invention. In the conceivable control apparatus of FIG. 4, a capacitor Cx is connected between the drain and the gate of the switching element 54. The capacitor Cx provides signal feedback from the drain to the gate of the switching element 54, thereby decreasing the rate of a voltage variation and hence suppressing radio-frequency noise upon every change of the switching element 54 to its on state or its off state.

The conceivable control apparatus of FIG. 4 has difficulty preventing the voltage VD at the anode of the flywheel diode D51 from overshooting due to the impedance of the flywheel current path. Accordingly, it tends to be difficult to effectively suppress MF-band noise. In the conceivable control apparatus of FIG. 4, a greater capacitance of the capacitor Cx enhances the suppression of radio-frequency noise. As the capacitance of the capacitor Cx increases, the switching loss provided in the switching element 54 increases and the switching element 54 generates a larger rate of heat.

The conceivable control apparatus of FIG. 4 has difficulty preventing a recovery current in the flywheel diode D51 from causing VHF-band noise upon every change of the switching element 54 to its on state.

Figure 5:
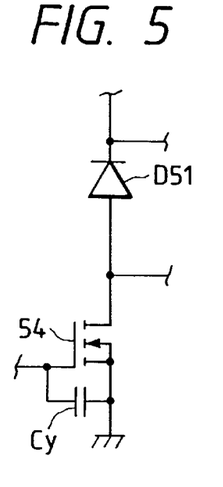
FIG. 5 is a schematic diagram of a part of a third conceivable control apparatus.

FIG. 5 shows a third conceivable control apparatus which is not prior art with respect to this invention. In the conceivable control apparatus of FIG. 5, a capacitor Cy is connected between the source and the gate of the switching element 54. The capacitor Cy decreases the rate of a voltage variation and hence suppresses radio-frequency noise upon every change of the switching element 54 to its on state or its off state.

The conceivable control apparatus of FIG. 5 has difficulty preventing the voltage VD at the anode of the flywheel diode D51 from overshooting due to the impedance of the flywheel current path. Accordingly, it tends to be difficult to effectively suppress MF-band noise. In the conceivable control apparatus of FIG. 5, a greater capacitance of the capacitor Cy enhances the suppression of radio-frequency noise. As the capacitance of the capacitor Cy increases, the switching loss provided in the switching element 54 increases and the switching element 54 generates a larger rate of heat.

The conceivable control apparatus of FIG. 5 has difficulty preventing a recovery current in the flywheel diode D51 from causing VHF-band noise upon every change of the switching element 54 to its on state.

Figure 6:
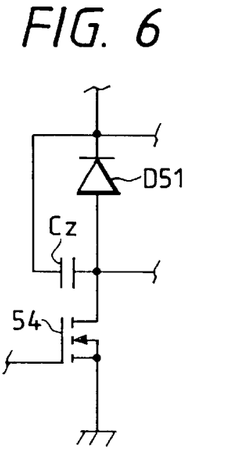
FIG. 6 is a schematic diagram of a part of a fourth conceivable control apparatus.

FIG. 6 shows a fourth conceivable control apparatus which is not prior art with respect to this invention. In the conceivable control apparatus of FIG. 6, a capacitor Cz is connected in parallel with the flywheel diode D51. The capacitor Cz suppresses the amplitude of radio-frequency noise caused by a recovery current in the flywheel diode D51 upon every change of the switching element 54 to its on state.

In the conceivable control apparatus of FIG. 6, when the switching element 54 changes to its on state, a rush current caused by the dc power supply 52 flows through the capacitor Cz and the switching element 54. The rush current tends to damage the switching element 54 and related parts.

The conceivable control apparatus of FIG. 6 has difficulty preventing the voltage VD at the anode of the flywheel diode D51 from overshooting due to the impedance of the flywheel current path. The overshoot causes MF-band noise which efficiently travels toward the dc power supply 52 via the capacitor Cz. Accordingly, it is difficult to suppress the MF-band noise.

First Embodiment of the Present Invention

Figure 7:
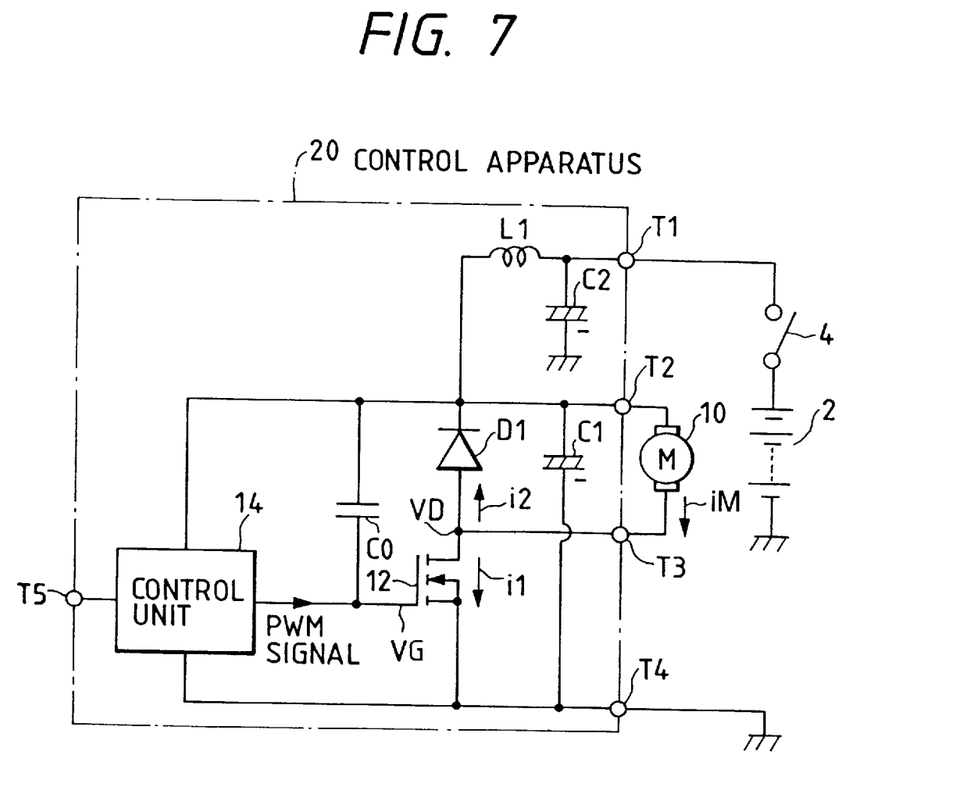
FIG. 7 is a schematic diagram of a control apparatus for an electric motor according to a first embodiment of this invention.

FIG. 7 shows an electric motor 10 which corresponds to a power source for a fuel pump in an automotive vehicle. The electric motor 10 is of the dc-powered type. A control apparatus 20 for the electric motor 10 has a power supply terminal T1, motor terminals T2 and T3, a ground terminal T4, and an input terminal T5.

The power supply terminal T1 of the control apparatus 20 is connected to the positive terminal of a dc power supply 2 via an ignition switch 4 in the automotive vehicle. Generally, a battery mounted on the automotive vehicle is used as the dc power supply 2. The motor terminals T2 and T3 of the control apparatus 20 are connected to power feed terminals of the electric motor 10 respectively. The ground terminal T4 of the control apparatus 20 is connected to the negative terminal of the dc power supply 2 via a ground line. The input terminal T5 of the control apparatus 20 receives a command signal from, for example, a fuel injection apparatus (not shown). The command signal represents a desired rotational speed of the electric motor 10, that is, a desired rotational speed of the fuel pump.

The control apparatus 20 includes a switching element 12 composed of an n-channel MOS-FET. The drain of the switching element 12 is connected to the motor terminal T3. The source of the switching element 12 is connected to the ground terminal T4. Accordingly, the motor terminal T3 and the ground terminal T4 are connected via the source-drain path of the switching element 12. The switching element 12 assumes either an on state or an off state in response to a potential at the gate thereof. When the switching element 12 assumes its on state, the connection between the motor terminal T3 and the ground terminal T4 is enabled. When the switching element 12 assumes its off state, the connection between the motor terminal T3 and the ground terminal T4 is blocked.

The control apparatus 20 includes a control unit 14 connected to the gate of the switching element 12, the ground terminal T4, and the input terminal T5. The control unit 14 is also connected to the power supply terminal T1 via a choke coil L1. The control unit 14 receives the command signal via the input terminal T5. The control unit 14 generates a pulse width modulation (PWM) signal having a duty cycle or a duty factor depending on the command signal. The control unit 14 outputs the PWM signal to the gate of the switching element 12. Accordingly, the switching element 12 changes between its on state and its off state in response to the PWM signal. In view of the life of a brush in the electric motor 10, the level of sound caused by magnetism in the electric motor 10, and the effect of switching noise on other devices, it is preferable to set the frequency of the PWM signal (that is, the switching frequency related to the switching element 12) in the range of several kilohertz to several tens of kilohertz.

The control apparatus 20 further includes a flywheel diode D1, and capacitors C0, C1, and C2. The anode of the flywheel diode D1 is connected to the motor terminal T3. The cathode of the flywheel diode D1 is connected to the motor terminal T2. Upon every change of the switching element 12 to its off state, the flywheel diode D1 allows a flywheel current to flow therethrough. The capacitor C1 is connected between the motor terminal T2 and the ground terminal T4. The capacitor C1 serves to absorb ripple components of a motor current iM flowing through the electric motor 10. The motor terminal T2 is connected via the choke coil L1 to the power supply terminal T1. One end of the capacitor C2 is connected to the junction between the choke coil L1 and the power supply terminal T1. The other end of the capacitor C2 is grounded. The choke coil L1 and the capacitor C2 compose an LC low pass filter acting on a drive current fed from the dc power supply 2 to the electric motor 10.

The capacitor C0 forms an important part of the present invention and is used to suppress radio-frequency noise. One end of the capacitor C0 is connected to the gate of the switching element 12. The other end of the capacitor C0 is connected to the motor terminal T2.

The control unit 14 is connected to the power supply terminal T1 via the LC low pass filter composed of the choke coil L1 and the capacitor C2. The control unit 14 is connected to the ground terminal T4. These connections allow the drive power to be fed to the control unit 14 from the dc power supply 2 via the LC low pass filter. In this way, the control unit 14 is powered by the dc power supply 2.

Figure 8:
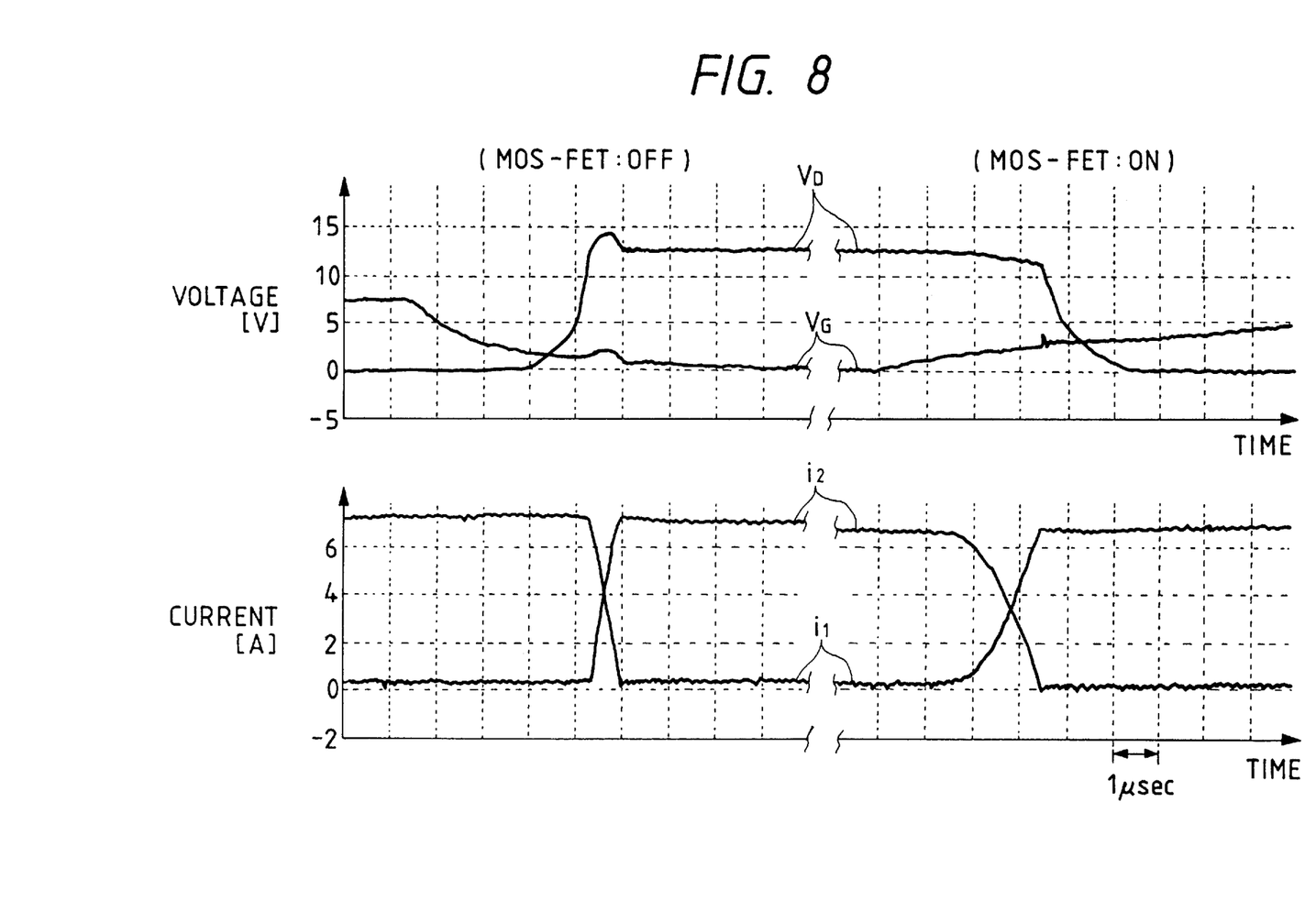
FIG. 8 is a time-domain diagram of voltages and currents in the control apparatus of FIG. 7.

Experiments were performed with the control apparatus 20 in FIG. 7 under conditions similar to the conditions of the previously-mentioned experiments with the prior-art control apparatus of FIG. 1. During the experiments, the control apparatus 20 was operated while measurements were taken of the voltage VD at the anode of the flywheel diode D1, the gate voltage VG of the switching element 12, the motor current i1 flowing through the motor 10 and the switching element 12, and a flywheel current i2 flowing through the flywheel diode D1. FIG. 8 shows the experimentally-available time-domain variations in the voltages VD and VG and the currents i1 and i2.

With reference to FIG. 8, a current i1 flows from the dc power supply 2 to the ground line via the electric motor 10 and the switching element 12 as a motor current iM while the switching element 12 continues to be in its on state. When the switching element 12 changes from its on state to its off state, the current i1 is interrupted and a flywheel current i2 flows. The flywheel current i2 is directed toward the electric motor 10. Upon every change of the switching element 12 to its off state, the voltage VD at the anode of the flywheel diode D1 rises and the flywheel current i2 starts to flow. At this time, a current flows through the capacitor C0, and the gate voltage VG of the switching element 12 rises. The rise in the gate voltage VG moves the switching element 12 toward or into its on state, thereby decreasing the rate of the increase in the flywheel current i2. Accordingly, it is possible to prevent the voltage VD at the anode of the flywheel diode D1 from overshooting due to the impedance of the path along which the flywheel current i2 flows. Thus, voltage ripples and MF-band (mediate frequency band) noise caused by the overshoot are prevented from occurring in the power feed line between the dc power supply 2 and the electric motor 10.

With reference to FIG. 8, the flywheel current i2 flows toward the electric motor 10 while the switching element 12 continues to be in its off state. When the switching element 12 changes from its off state to its on state, the flywheel current i2 is interrupted and the current i1 restarts to flow from the dc power supply 2 to the ground line via the electric motor 10 and the switching element 12 as a motor current iM. Upon every change of the switching element 12 to its on state, the capacitor C0 lowers the rate of an increase in the gate voltage VG of the switching element 12 and hence lowers the rate of an increase in the current i1. The lower rate of the increase in the current i1 causes a lower rate of a decrease in the flywheel current i2 so that a recovery current occurring in the flywheel diode D1 has a variation with a smaller amplitude and a smaller rate. Accordingly, it is possible to suppress the ringing caused by the recovery current, and hence to suppress VHF-band (very high frequency band) noise.

As previously described, the control apparatus 20 can suppress radio-frequency noise in an MF band and also a VHF band which would be caused by the switching operation of the switching element 12. Thus, it is possible to prevent a radio receiver or other electronic devices from being adversely affected by such radio-frequency noise.

In the control apparatus 20, the LC low pass filter composed of the choke coil L1 and the capacitor C2 absorbs the switching noise caused by the switching element 12. Thus, the LC low pass filter prevents the switching noise from leaking toward a side of the dc power supply 2. The capacitor C1 absorbs ripple components of the motor current iM, thereby stabilizing the operation of the electric motor 10.

Figure 9:
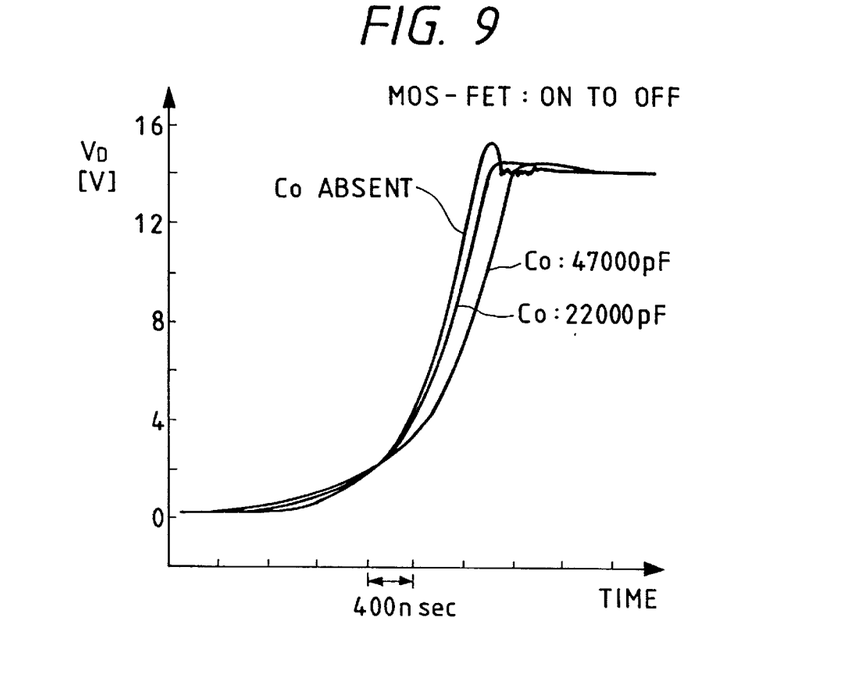
FIG. 9 is a time-domain diagram of a voltage which occurs upon the change of a switching element to its off state with each of the different capacitances of a noise suppressing capacitor in the control apparatus of FIG. 7.

FIG. 9 shows three time-domain variations in the voltage VD at the anode of the flywheel diode D1 which occur when the switching element 12 changes from its on state to its off state. The three time-domain variations are available in the case where the capacitance of the capacitor C0 equals 0 (the absence of the capacitor C0), 22,000 pF, and 47,000 pF respectively. It is shown in FIG. 9 that as compared with the capacitor C0 with 22,000 pF, the capacitor C0 with 47,000 pF more effectively prevents the voltage VD at the anode of the flywheel diode D1 from overshooting upon every change of the switching element 12 to its off state.

Figure 10:
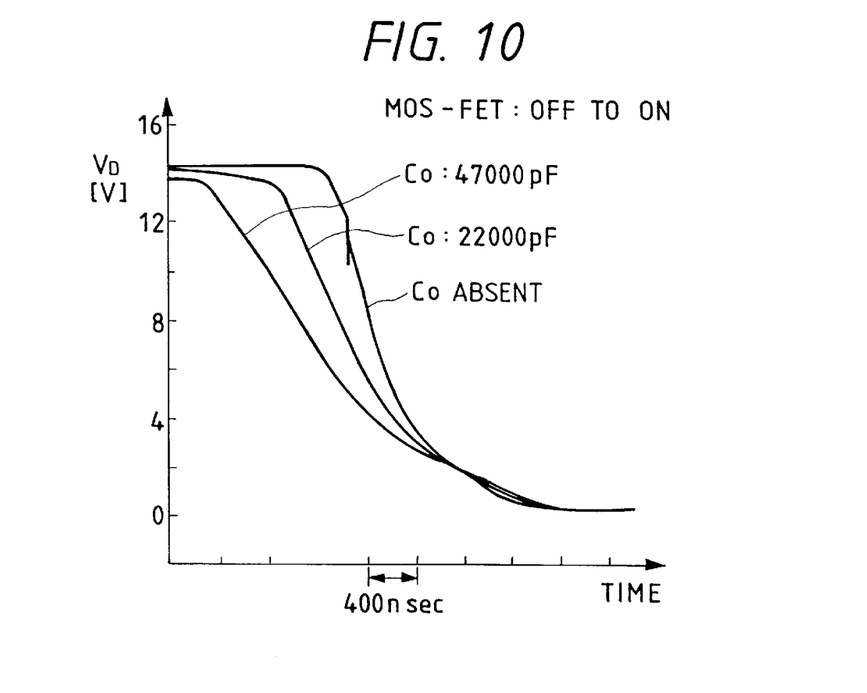
FIG. 10 is a time-domain diagram of a voltage which occurs upon the change of the switching element to its on state with each of the different capacitances of the noise suppressing capacitor in the control apparatus of FIG. 7.

FIG. 10 shows three time-domain variations in the voltage VD at the anode of the flywheel diode D1 which occur when the switching element 12 changes from its off state to its on state. The three time-domain variations are available in the case where the capacitance of the capacitor C0 equals 0 (the absence of the capacitor C0), 22,000 pF, and 47,000 pF respectively. It is shown in FIG. 10 that as compared with the capacitor C0 with 22,000 pF, the capacitor C0 with 47,000 pF more effectively suppresses a ringing upon every change of the switching element 12 to its on state.

It is understood from the previous description that the generation of radio-frequency noise is more effectively suppressed as the capacitance of the capacitor C0 increases. An excessively great capacitance of the capacitor C0 tends to adversely affect the switching operation of the switching element 12. It is preferable to suitably set the capacitance of the capacitor C0 in accordance with a system to which the control apparatus 20 is applied.

The electric motor 10 for the fuel pump may be replaced by an electric motor for another apparatus such as an air conditioning apparatus in the automotive vehicle. Also, the electric motor 10 for the fuel pump may be replaced by an electric motor which is unrelated to the automotive vehicle.

Second Embodiment

Figure 11:
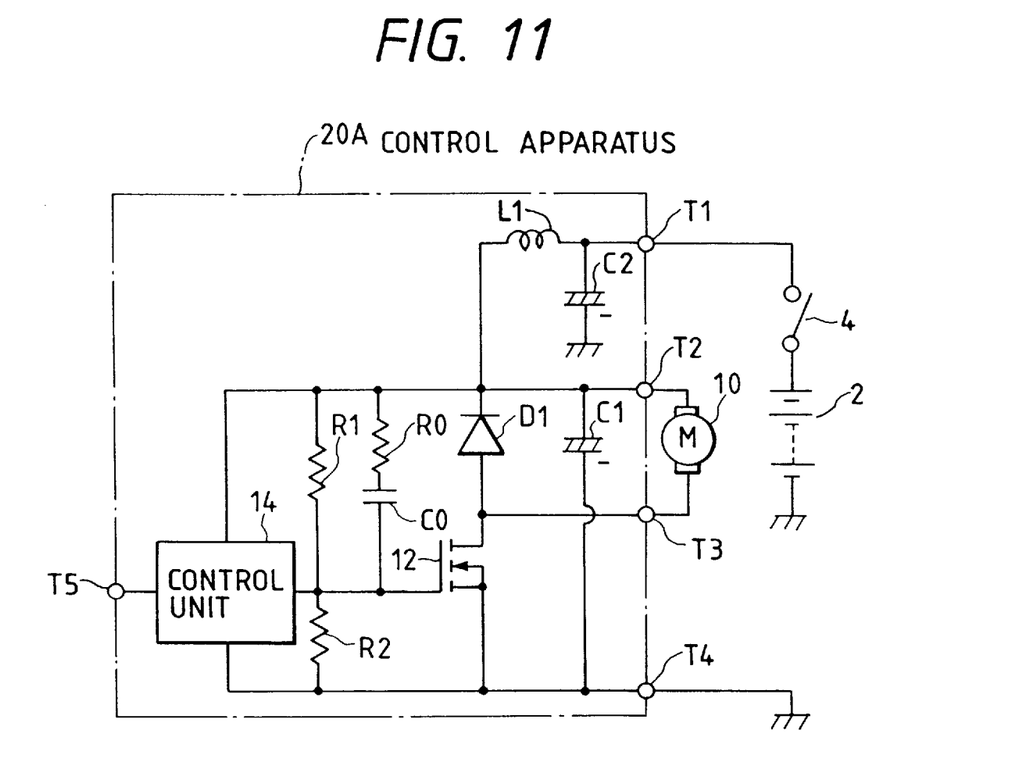
FIG. 11 is a schematic diagram of a control apparatus for an electric motor according to a second embodiment of this invention.

FIG. 11 shows a second embodiment of this invention which is similar to the embodiment of FIG. 7 except for additional arrangements which will be described below. The embodiment of FIG. 11 is directed to a control apparatus 20A which replaces the control apparatus 20 in FIG. 7.

As shown in FIG. 11, the control apparatus 20A includes resistors R0, R1, and R2. The resistor R0 is connected in series with a capacitor C0. The resistor R0 limits a current flowing through the capacitor C0. The resistor R1 is connected between a motor terminal T2 and the gate of a switching element 12. The resistor R2 is connected between a ground terminal T4 and the gate of the switching element 12. The resistors R1 and R2 control and determine the switching speed of the switching element 12.

The resistor R0 limits a rush current which flows through the capacitor C0 upon every change of the switching element 12 to its off state. In addition, the resistor R0 limits a current which flows through the capacitor C0 due to foreign noise coming from a side of a dc power supply 2. The current limitation by the resistor R0 prevents a PWM-signal outputting element in a control unit 14 from being exposed to an excessively large rush current. In addition, the current limitation by the resistor R0 prevents the foreign noise from reaching the control unit 14 and causing improper operation.

It is preferable to set the resistances of the resistors R1 and R2 to equalize the time length of the off-to-on change and the time length of the on-to-off change of the switching element 12. This setting minimizes the switching loss provided by the switching element 12. Specifically, the resistances of the resistors R1 and R2 determine the time intervals until the moments at which the gate voltage reaches the threshold voltage of the switching element 12 in connection with the off-to-on change and the on-to-off change of the switching element 12. The resistances of the resistors R1 and R2 are chosen to equalize these time intervals. It should be noted that one of the resistors R1 and R2 may be omitted.

What is claimed is:

1. A control apparatus for an electric motor having first and second power feed terminals, the apparatus comprising:
   a dc power supply;
   a power feed line connecting the dc power supply and the electric motor;
   a switching element provided in the power feed line and including a MOS-FET having a parasitic capacitance and a gate subjected to a pulse width modulation signal with a controllable duty cycle, the switching element changing between its on state and its off state in response to the pulse width modulation signal, wherein the first power feed terminal of the electric motor is connected to the switching element;
   a flywheel diode connected in parallel with the electric motor for absorbing a voltage which appears across the electric motor by conducting a current through the flywheel diode when the electric motor turns to an off state; and
   a capacitor connected between the gate of the MOS-FET and the second power feed terminal of the electric motor for decreasing a speed of a variation in a voltage at the gate of the MOS-FET, said capacitor being different than said parasitic capacitance.

2. A control apparatus as recited in claim 1, further comprising a resistor connected between the gate of the MOSFET and one of positive and negative terminals of the dc power supply for suitably setting a switching speed related to the switching element.

3. A control apparatus as recited in claim 1, further comprising a resistor connected in series with the capacitor for limiting a current flowing through the capacitor.

4. A control apparatus as recited in claim 1, further comprising a second capacitor connected to the electric motor for absorbing a ripple current which flows through the electric motor due to a switching operation of the switching element, said second capacitor being different than said parasitic capacitance.

5. A control apparatus as recited in claim 1, further comprising an LC filter provided in the power feed line for blocking propagation of switching noise from the switching element toward the dc power supply, the LC filter including a combination of a choke coil and a filter capacitor.

6. A control apparatus as recited in claim 1, wherein the parasitic capacitance is formed between the gate and a source of the MOS-FET.

7. An apparatus comprising:
   a dc power supply;
   an electric motor;
   a switch; and
   a capacitor having first and second ends;
   wherein the dc power supply, the electric motor, and the switch are connected in a closed loop;
   the switch has a parasitic capacitance and a control terminal subjected to a pulse width modulation signal;
   the switch changes between its on state and its off state in response to the pulse width modulation signal;
   the first end of the capacitor is connected to the control terminal of the switch;
   the second end of the capacitor is connected to a junction between the electric motor and the power supply; and
   the capacitor is different than said parasitic capacitance.

8. An apparatus as recited in claim 7, further comprising a resistor connected in series with the capacitor.

9. A control apparatus as recited in claim 7, wherein the parasitic capacitance is associated with the control terminal of the switch.

10. A control apparatus for an electric motor having first and second power feed terminals, the apparatus comprising:
    a dc power supply;
    a power feed line connecting the dc power supply and the electric motor;
    a switching element provided in the power feed line and including a MOS-FET having a parasitic capacitance and a gate subjected to a pulse width modulation signal with a controllable duty cycle, the switching element changing between its on state and its off state in response to the pulse width modulation signal, wherein the first power feed terminal of the electric motor is connected to the switching element;
    a flywheel diode connected in parallel with the electric motor for absorbing a voltage which appears across the electric motor by conducting a current through the flywheel diode when the electric motor turns to an off state;
    a capacitor connected between the gate of the MOS-FET and the second power feed terminal of the electric motor for suppressing radio-frequency noise occurring upon every change of the switching element between its on state and its off state, said capacitor being different than said parasitic capacitance; and
    a resistor connected in series with the capacitor for limiting a current flowing through the capacitor.

11. A control apparatus for an electric motor having first and second power feed terminals, the apparatus comprising:
    a dc power supply;
    a power feed line connecting the dc power supply and the electric motor;
    a switching element provided in the power feed line and including a MOS-FET having a parasitic capacitance and a gate subjected to a pulse width modulation signal with a controllable duty cycle, the switching element changing between its on state and its off state in response to the pulse width modulation signal, wherein the first power feed terminal of the electric motor is connected to the switching element;
    a flywheel diode connected in parallel with the electric motor for absorbing a voltage which appears across the electric motor by conducting a current through the flywheel diode when the electric motor turns to an off state;
    a first capacitor connected between the gate of the MOS-FET and the second power feed terminal of the electric motor for suppressing radio-frequency noise occurring upon every change of the switching element between its on state and its off state, said first capacitor being different than said parasitic capacitance;
    a resistor connected in series with the first capacitor for limiting a current flowing through the first capacitor; and
    a second capacitor connected to the electric motor for absorbing a ripple current which flows through the electric motor due to switching operation of the switching element.

* * * * *